United States Patent [19]

Ashizawa et al.

[11] Patent Number: 5,168,077
[45] Date of Patent: Dec. 1, 1992

[54] METHOD OF MANUFACTURING A P-TYPE COMPOUND SEMICONDUCTOR THIN FILM CONTAINING A III-GROUP ELEMENT AND A V-GROUP ELEMENT BY METAL ORGANICS CHEMICAL VAPOR DEPOSITION

[75] Inventors: Yasuo Ashizawa, Kawasaki; Takao Noda, Yokohama; Mitsuhiro Kushibe; Masahisa Funemizu, both of Tokyo; Kazuhiro Eguchi, Yokohama; Yasuo Ohba, Yokohama; Yoshihiro Kokubun, Yokohama, all of Japan

[73] Assignee: Kabushiki Kaisha Toshiba, Kawasaki, Japan

[21] Appl. No.: 501,781

[22] Filed: Mar. 29, 1990

[30] Foreign Application Priority Data

Mar. 31, 1989 [JP] Japan .................................. 1-83587
May 31, 1989 [JP] Japan ................................. 1-138858
Jun. 1, 1989 [JP] Japan ................................. 1-137461
Sep. 25, 1989 [JP] Japan ................................. 1-248925

[51] Int. Cl.$^5$ .......................................... H01L 21/20
[52] U.S. Cl. ....................... 437/107; 437/95; 437/108; 437/111; 437/112; 437/945; 437/946; 148/DIG. 57; 148/DIG. 110; 156/610
[58] Field of Search ............... 148/DIG. 17, 25, 56, 148/65, 57, 110, 97, 169, 33, 33.3, 33.4; 156/610-614; 427/298.1, 255.1; 437/81, 88, 95, 96, 131, 105, 107, 108, 111, 112, 945, 946, 949, 971

[56] References Cited

U.S. PATENT DOCUMENTS

| | | | |
|---|---|---|---|
| 4,220,488 | 9/1980 | Duchemin et al. | 437/81 |
| 4,370,510 | 1/1983 | Stim | 437/5 |
| 4,588,451 | 5/1986 | Vernon | 437/126 |
| 4,632,710 | 12/1986 | Van Rees | 437/81 |
| 4,766,092 | 8/1988 | Kuroda et al. | 437/110 |
| 4,826,784 | 5/1989 | Salerno et al. | 437/89 |
| 4,908,074 | 3/1990 | Hosoi et al. | 148/33.2 |
| 4,935,381 | 6/1990 | Speckman et al. | 437/81 |

FOREIGN PATENT DOCUMENTS 63-143810 6/1988 Japan .

OTHER PUBLICATIONS

Journal of Crystal Growth, vol. 57, 1982, pp. 605-605, North-Holland, Amsterdam, NL; A. Escobosa et al.: "Low temperature growth of MOCVD GaAs layers at atmospheric pressure" p. 605, col. 1, line 16-column 2, line 17; figure 2*.

Applied Physics Letters, vol. 50, No. 19, May 11, 1987, pp. 1386-1387, American Institute of Physics, New York, NY, US; D. W. Vook et al.: "Growth of GaAs by metalorganic chemical vapor deposition using thermally decomposed trimethylarsenic" *p. 1386, col. 1, line 34 col. 2, line 24; figure 2*.

(List continued on next page.)

Primary Examiner—Robert Kunemund
Attorney, Agent, or Firm—Oblon, Spivak, McClelland, Maier & Neustadt

[57] ABSTRACT

A p-type GaAs or AlGaAs thin film is formed by a MOCVD method. In the growing step of the thin film, the thin film is doped with a high concentration of carbon atoms forming an acceptor level such that the carrier concentration of the thin film falls within the range of between $1 \times 10^{18}$ cm$^{-3}$ and $1 \times 10^{20}$ cm$^{-3}$. At least one of trimethyl gallium and trimethyl aluminum is used as a raw material gaseous compound of III-group element, and arsine is used as a raw material gaseous compound of V-group element. The thin film is formed by an epitaxial growth under the molar ratio V/III of the V-group element supply rate to the III-group element supply rate, which is set at such a small value as 0.3 to 2.5, the temperature of 450 to 700° and the pressure of 1 to 400 Torr. The thin film formed under these conditions exhibits a mirror-like smooth surface, and the film-growth rate is dependent on the supply rate of the V-group element.

17 Claims, 8 Drawing Sheets

OTHER PUBLICATIONS

Japanese Journal of Applied Physics, vol. 21, No. 11, Nov. 1982, p. L705-L706, Tokyo, JP; N. Kobayashi et al.: "Comparison between atmospheric and reduced pressure GaAs MOCVD".

Journal of Applied Physics, vol. 58, No. 8, pp. R31-R55, Oct. 1985, American Institute of Physics, Woodubry, NY, US; M. J. Ludowise: "Metalorganic Chemical Vapor Deposition of III-V Semiconductors" *pp. R36-R43: GaAs and $Al_xGa_{1-x}As$*.

Applied Physics Letters, vol. 53, No. 18, Oct. 31, 1988, pp. 1726-1728, American Institute of Physics, New York, US; H. Nakagome et al.: "Extremely sharp erbium-related intra-4f-shell photoluminescene of ernium-doped GaAs grown by metalorganic chemical vapor deposition".

Journal of Applied Physics, vol. 64, No. 8, Oct. 15, 1988, pp. 3975, American Institute of Physics, Woodbury, NY, US; K. Saito et al.: "Characterization of p-type GaAs hevily doped with carbon grown by metalorganic molecular-beam epitaxy".

Appl. Phys. Lett. 54(1), pp. 39-41, Jan. 2, 1989, Makimoto et al.: "AlGaAs/GaAs heterojunction bipolar transistors with heavily C-doped base layers grown by flow-rate modulation . . .".

Japanese Journal of Applied Physics, vol. 24, No. 9, Sept., 1985 pp. 1189-1192 Tokumitsu et al: "Metalorganic molecular-beam epitaxial growth and characterization of GaAs using trimethyl-and triethyl-. . .".

APPL. PHYS. LETT. 52 (7), pp. 522-524; Feb. 15, 1988, Guido et al: "Carbon-doped $Al_xGA_{1-x}As$-GaAs quantum well lasers".

IEEE ELECTRON DEVICE LETTERS, vol. 9, No. 9, Sep. 1988, Bhat et al: "Atomic layer epitaxy grown heterojunction bipolar transistor having a carbon-doped base".

APPL. PHYS. LETT. 53 (14), pp. 1317-1319, Oct. 3, 1988, Kuech et al: "Controlled carbon doping of GaAs by metalorganic vapor phase epitaxy."

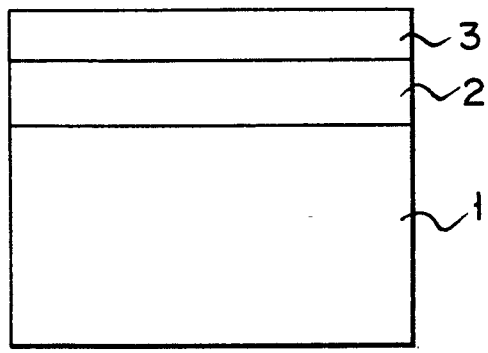
F I G. 1
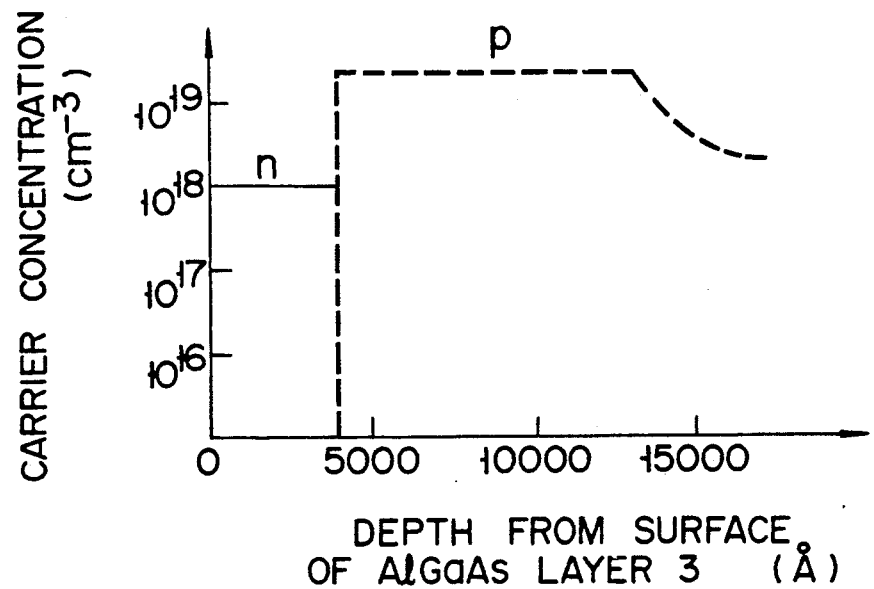
F I G. 2

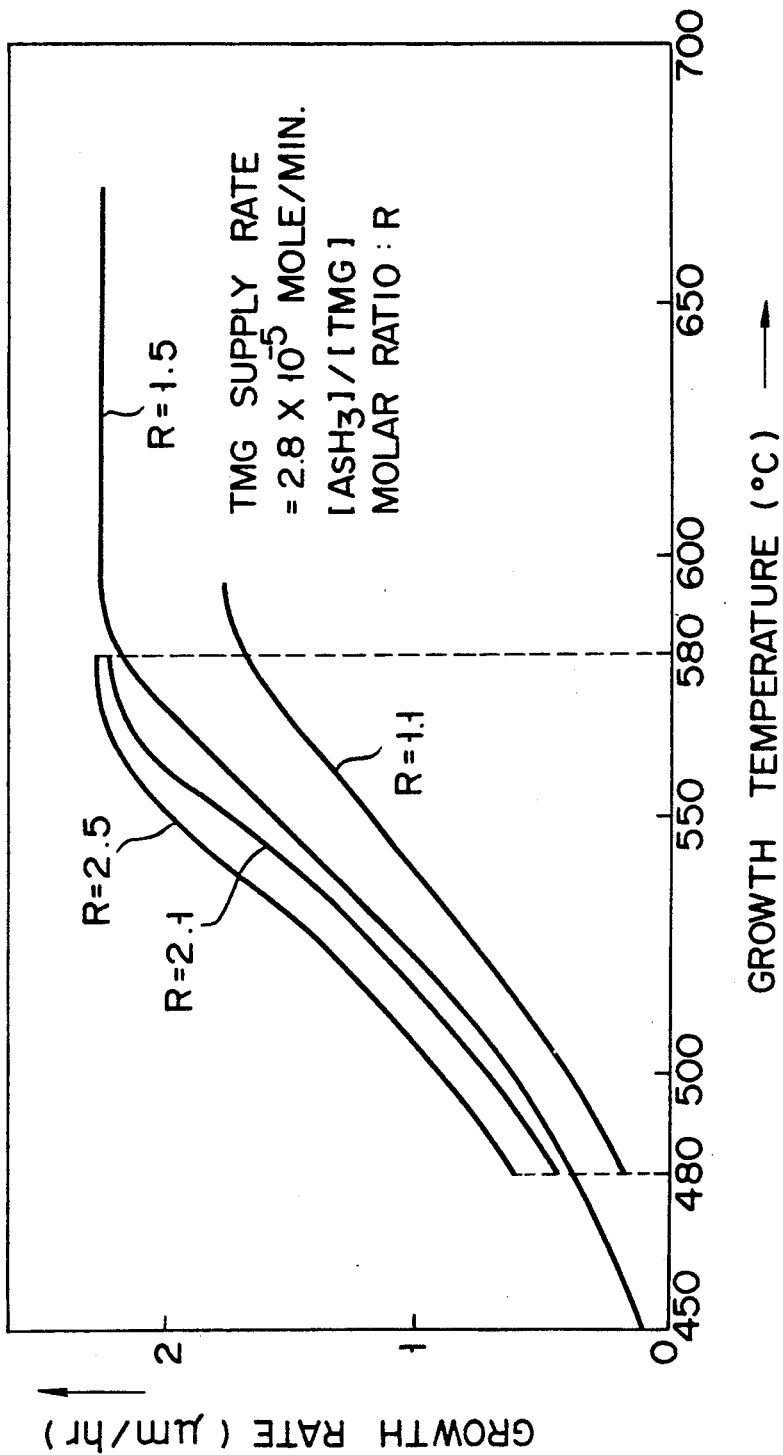
F I G. 5

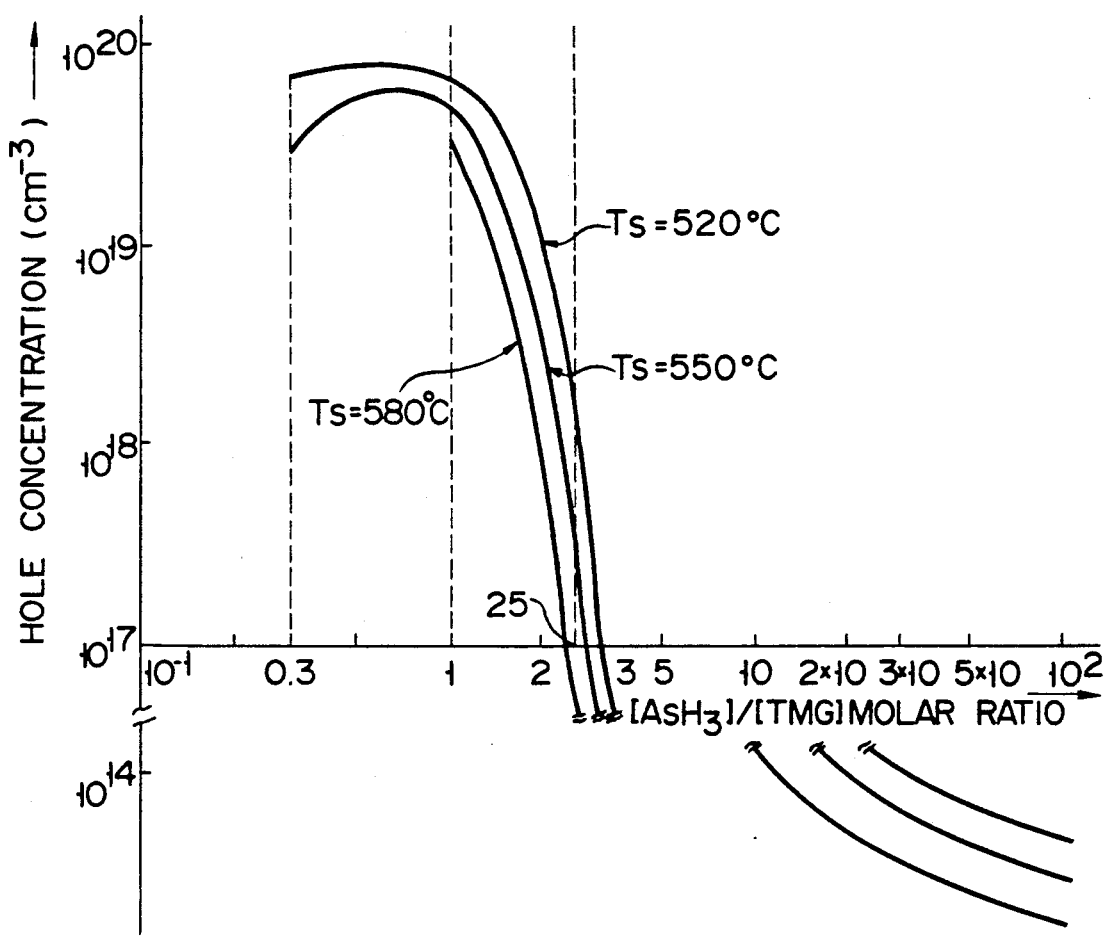
F I G. 6

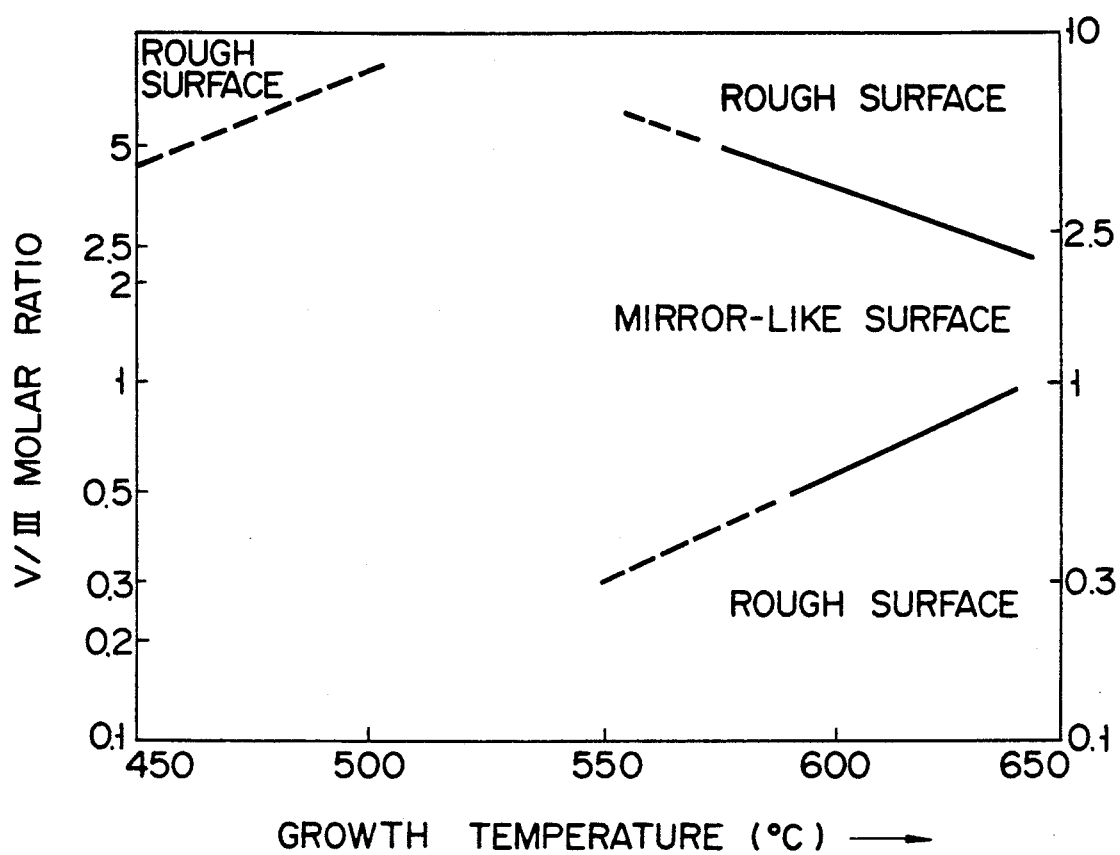
F I G. 7

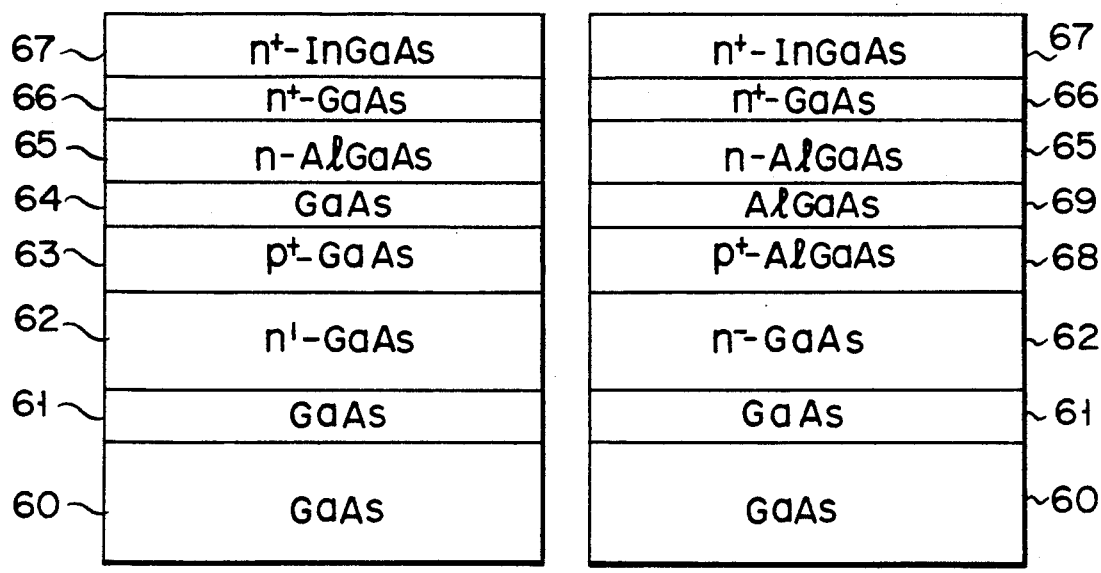
F I G. 8A  F I G. 8B
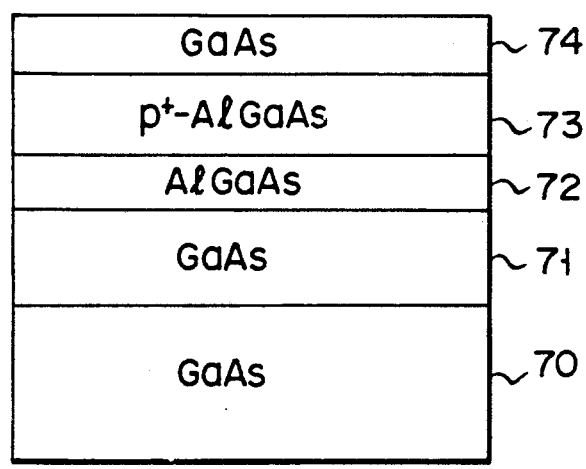
F I G. 9

METHOD OF MANUFACTURING A P-TYPE COMPOUND SEMICONDUCTOR THIN FILM CONTAINING A III-GROUP ELEMENT AND A V-GROUP ELEMENT BY METAL ORGANICS CHEMICAL VAPOR DEPOSITION

BACKGROUND OF THE INVENTION

1. Field of the Invention

The present invention relates to a method of manufacturing a III-V group compound semiconductor thin film by means of metal organics chemical vapor deposition (MOCVD), more particularly, to a method of growing a p-type GaAs layer or AlGaAs layer.

2. Description of the Related Art

The MOCVD method is widely employed for growing a III-V group compound semiconductor film. If the supply ratio of the V-group element material to the III-group element material, i.e., V/III ratio, is low in the manufacture of the compound semiconductor film, deterioration of the surface morphology and reduction in the film-growth rate are brought about simultaneously. To overcome the difficulty, it was customary in the past to set the V/III ratio at a level high enough to prevent the deterioration of the surface morphology. Consequently, the efficiency of utilizing the V-group material was very low in the past. It is known to the art to thermally decompose the V-group material in order to improve the efficiency of utilizing the V-group material. However, this method is incapable of achieving an epitaxial growth of the III-V group compound semiconductor of a high quality and, thus, is not practical.

It was conventional to use Be, Zn, Mg, or Cd as a p-type dopant of the III-V group compound semiconductor. Beryllium certainly permits doping at a high concentration, but is highly poisonous. On the other hand, each of Zn, Mg and Cd exhibits a high vapor pressure, is low in doping efficiency under high growth temperatures, is likely to be adsorbed on the wall of a pipe, and tends to exhibit a memory effect that intake of the raw material gas is delayed, resulting in failure to obtain abrubt dopant profiles.

Carbon, which is used as an acceptor in a III-V group compound semiconductor, is known to exhibit good electrical properties. However, only a few reports have been published to data concerning a dopant material suitable for achieving a carbon doping in the MOCVD method. Under the circumstances, it was very difficult to manufacture a p-type GaAs or AlGaAs layer having a high carrier concentration by the MOCVD method.

As a method of achieving carbon doping without using new dopant material, it is proposed to alternately supply a trimethylgallium (TMG) gas and an arsine (AsH$_3$) gas in the step of growing a GaAs layer by the MOCVD method. In this method, however, a heavy burden is given to, for example, a valve mounted in the gas supply system because it is necessary to switch frequently the supply of the two different gases. Further, it is necessary to sufficiently evacuate the reaction furnace in switching the gas supply. In other words, a long gas switching time is required, leading to a low growth rate of a thin film.

To reiterate, carbon is an effective p-type impurity used in a GaAs or AlGaAs semiconductor. However, a suitable dopant material for achieving carbon doping in the MOCVD method has not yet been found. On the other hand, the method of growing a p-type GaAs layer while alternately supplying TMC and AsH$_3$ gases necessitates a frequent switching of the gas supply, leading to a heavy burden to the apparatus and to a low growth rate of the GaAs layer. Under the circumstances, it was very difficult to manufacture a p-type GaAs or AlGaAs layer having a high carrier concentration by the MOCVD method.

SUMMARY OF THE INVENTION

An object of the present invention is to provide a method of manufacturing a compound semiconductor thin film by the MOCVD method, which permits doping carbon in the growing film at a high concentration and with high controllability.

Another object is to provide a method of manufacturing a compound semiconductor thin film without bringing about a heavy burden given to the manufacturing apparatus and a reduction in the film growing rate.

According to an aspect of the present invention, there is provided a method of manufacturing a p-type compound semiconductor thin film containing a III-group element of at least one of Ga and Al and a V-group element of As by metal organics chemical vapor deposition (MOCVD), characterized in that an alkylated compound having a methyl group is used as a raw material gas of the III-group element compound, a hydrogenated compound is used as a raw material gas of the V-group element compound, and the film is grown epitaxially under a condition that the molar ratio (V/III) of the V-group element supply rate to the III-group element supply rate is set to fall within the range of between a first condition in which said ratio V/III is smaller than 1 and a non-mirror growth takes place and a second condition in which said ratio is larger than 1 and a non-mirror growth takes place so as to bring about a mirror growth.

According to another aspect of the present invention, there is provided a method of manufacturing a p-type compound semiconductor thin film containing a III-group element of at least one of Ga and Al and a V-group element of As by metal organics chemical vapor deposition (MOCVD), characterized in that an alkylated compound having a methyl group is used as a raw material gas of the III-group element compound, a hydrogenated compound is used as a raw material gas of the V-group element compound, and the film is grown epitaxially under a condition that the growth rate of the thin film is controlled by the supply rate of the hydrogenated compound of the V-group element.

The method of the present invention makes it possible to form a p-type GaAs or AlGaAs layer having such a high carrier concentration as $1 \times 10^{18}$ to $1 \times 10^{20}$ cm$^{-3}$ without using a new dopant material. To be more specific, the present invention permits doping a thin film grown by the MOCVD method with a high concentration of carbon. In addition, the carbon doping can be controlled accurately. Further, the burden applied to the apparatus is not increased and the film forming rate is not lowered in the present invention. It follows that the method of the present invention is effective in manufacturing a semiconductor device including a p-type GaAs or AlGaAs layer having a high carrier concentration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 1 illustrates a crystal having a pn junction, said crystal being manufactured by the method of the present invention;

FIG. 2 shows a carrier concentration profile of the crystal shown in FIG. 1;

FIG. 5 is a graph showing the relationship between the film-growth temperature and the film-growth rate with respect to thin films grown by the method of the present invention under various V/III molar ratios;

FIG. 6 is a graph showing the relationship between the film-growth temperature and the hole concentration with respect to thin films grown under various temperatures;

FIG. 7 is a graph showing the relationship among the film-growth temperature, the V/III molar ratio and the surface morphology of a thin film;

FIGS. 8A, 8B, 9 and 10 are cross sectional views each showing a semiconductor device manufactured by the method of the present invention; and FIG. 11 is a graph showing the relationship between the film-growth pressure and the hole concentration of a thin film.

DETAILED DESCRIPTION OF THE PREFERRED EMBODIMENTS

Figure 3:
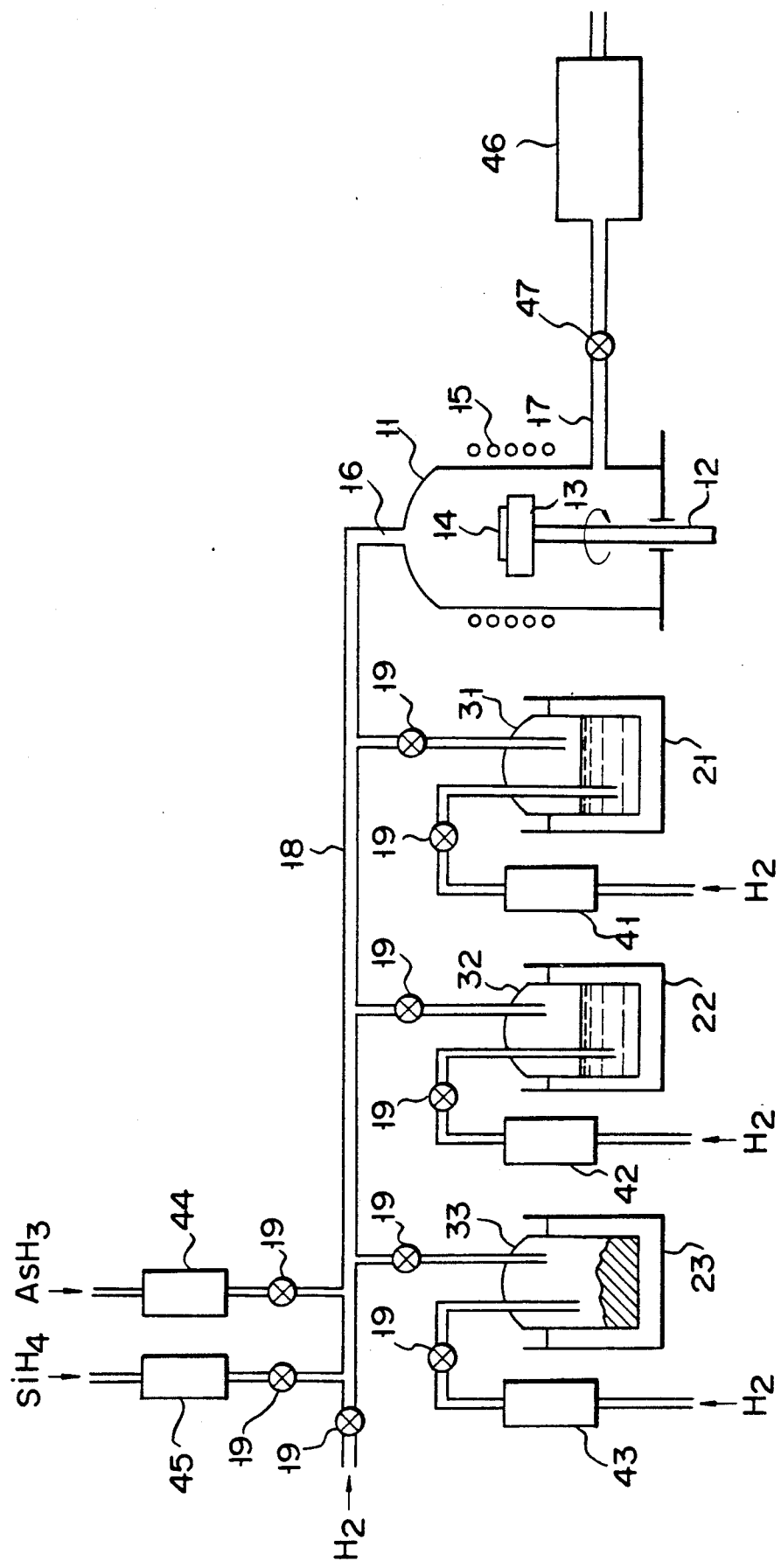
FIG. 3 schematically shows the construction of an MOCVD apparatus used for working the method of the present invention.

The method of the present invention permits growing a p-type compound semiconductor thin film of a high carrier concentration by the MOCVD method without using a new dopant material. In the present invention, the raw material gas is properly selected to achieve the object. The thin film manufactured by the method of the present invention contains a III-group element of at least one of Ga and Al, and a V-group element of As. The thin film is formed by epitaxial growth using an alkylated compound having a methyl group as a raw material gas of the III-group element and a hydrogenated compound as a raw material gas of the V-group element.

In the present invention, the molar ratio (V/III) of the V-group element supply rate to the III-group element supply rate is set to fall within the range of between a first condition in which said ratio V/III is smaller than 1 and growth of a thin film having a non-mirror like surface takes place and a second condition in which said ratio is larger than 1 and growth of a thin film having a non-mirror like surface takes place so as to bring about growth of a thin film having a mirror-like surface. It is also important to note that the growth rate of the thin film is controlled by the supply rate of the hydrogenated compound of the V-group element.

In a preferred embodiment of the present invention, at least one of trimethyl gallium (TMG) and trimethyl aluminum (TMA) is used as the alkylated compound of the III-group element. On the other hand, arsine ($AsH_3$) is used as the hydrogenated compound of the V-group element. It is desirable to set the molar ratio of As to the III-group element, i.e., V/III ratio, at 0.3 to 2.5. Also, it is desirable to perform the thin film growing operation under the temperatures of 450° to 700° C. and pressures of 1 to 400 Torr.

In the conventional process of growing a GaAs or AlGaAs thin film using TMG, TMA and $AsH_3$ as the raw material gases, the V/III ratio is set at 20 to 150 and the substrate is heated to 600° to 800° C. Since the compound of the V-group element, i.e., V-group compound, is supplied in a very large amount, compared with the amount of the compound of the III-group element, i.e., III-group compound, the thin film growing rate is not affected by the supply rate of the V-group compound and is proportional to only the supply rate of the III-group compound. If the V/III ratio is set lower than 20 in the conventional process, deterioration takes place in the surface morphology of the grown thin film.

The present inventors have found that, where the organometallic compound has a methyl group, a condition which permits growth of crystals having a complete mirror-like smooth surface is locally included in the conditions under which the V/III ratio is small so as to bring about deterioration of the surface morphology. It has been found that, if the V/III ratio is small, the carbon introduction into the growing thin film is increased, though the surface morphology of the growing thin film is certainly deteriorated. Further, if the V/III ratio is as small as 2.5 or less, deterioration of the surface morphology is diminished and the carbon introduction into the growing thin film rapidly increased. In the case of the V/III ratio being small, the film-growth rate is made proportional to the supply rate of the V-group compound. It has also been found that, where the substrate temperature falls within the range of between 450° and 650° C. and the V/III ratio falls within the range of between 0.3 and 2.5, the carbon introduction into the growing film is rapidly increased, making it possible to control accurately the hole concentration within the range of between $1 \times 10^{18}$ cm$^{-3}$ and $1 \times 10^{20}$ cm$^{-3}$.

In the method of the present invention, TMG or TMA is decomposed to form a compound semiconductor thin film containing Ga or Al. What should be noted is that the concentration of the reaction species, i.e., Ga or Al which is coupled with a methyl group or a —$CH_x$ (x=0 to 2) group, is high on the surface of the substrate on which a thin film is to be formed, with the result that the carbon introduction into the thin film is facilitated. The carbon atoms introduced into the thin film form an acceptor level. It is possible to control with a high reproducibility the carrier concentration in the p-type GaAs and/or AlGaAs layer by properly selecting the molar ratio of $AsH_3$ to TMG and/or TMA in the growing film and the film-growth temperature. In the present invention, the film-growth process is carried out continuously. In other words, the valve included in the apparatus need not be opened or closed during the film-growth operation. Naturally, disorder of the valve need not be worried about. Further, a new dopant material is not used in the present invention, making it possible to eliminate the memory effect. Thus, no detrimental effect is given to other films which may be formed later. Thus the method of the present invention makes it possible to achieve a steep doping profile, which is highly advantageous in the manufacture of a semiconductor device.

To reiterate, the method of the present invention permits overcoming the defects inherent in the conventional MOCVD method, and makes it possible to provide a semiconductor device comprising a p-type GaAs or AlGaAs layer having a high carrier concentration. What should also be noted is that the distribution of the carrier concentration is steep in the p-type compound semiconductor layer grown by the method of the present invention, enabling the produced semiconductor device to exhibit satisfactory characteristics.

Let us describe more in detail the present invention with reference to the accompanying drawings.

EXAMPLE 1

A GaAs film was formed by epitaxial growth using TMG, i.e., material of III-group element, and AsH$_3$, i.e., material of V-group element, as raw material gases. The GaAs film was grown at 620° C., with the gas flow speed set at 60 cm/min or more. The TMG gas and the AsH$_3$ gas were supplied at rates of $3 \times 10^{-6}$ mol/min to $1.8 \times 10^{-5}$ mol/min and $4 \times 10^{-6}$ mol/min to $8 \times 10^{-5}$ mol/min, respectively. The V/III ratio fell within the range of between 0.5 and 4. Where the V/III ratio was smaller than 0.5, Ga metal was deposited on the surface of the GaAs film formed. Where the V/III ratio was larger than 4, deterioration of the surface morphology was recognized in the GaAs film formed. The film-growth rate was found to be 1 μm/hr to 5 μm/hr. The grown GaAs film was found to be of p-type conductivity in any of the samples. It has also been found that the carrier concentration was increased with decrease in the V/III ratio. The p-type carrier concentration determined by Van der Pauw method was found to be $1 \times 10^{19}$ cm$^{-3}$ to $1 \times 10^{20}$ cm$^{-3}$. Also, the impurity concentration was measured by Secondary Ion Mass Spectrometry (SIMS), with the result that the carbon concentration was found to be substantially identical with the carrier concentration. The change in the lattice constant in this case was 0.02% or less, which was 1/5 or less the value in the case where Be was added to form substantially the same amount of carriers. Further, profile of the carbon concentration was examined, with the result that the carbon concentration was steeply changed from the level of $5 \times 10^{19}$ cm$^{-3}$ to the detectable lowest level of $10^{17}$ cm$^{-3}$ or less within a range less than the resolution of 300 Å.

The surface morphology was improved again where the V/III ratio in the raw material gases was 10 or more. In this case, however, a large number of hillocks, i.e., scores of tens to hundreds of thousands of hillocks per square centimeter, were recognized. On the contrary, where the V/III ratio was set small to permit the mirror-like growth as in the present invention, the hillock concentration was lower than 10,000/cm$^2$, which is substantially negligible.

Where triethyl gallium (TEG) was used in place of TMG as the III-group raw material, Ga metal was rapidly deposited on the growing GaAs film under the V/III ratio of 4 or less.

EXAMPLE 2

An AlGaAs film was formed by epitaxial growth using as raw material gases TMA and TMG (materials of III-group elements), and AsH$_3$ (material of V-group element). The AlGaAs film was grown at 560° to 620° C., with the gas flow speed set at 60 cm/min or more. The AsH$_3$ gas was supplied at a rate of $1 \times 10^{-6}$ mol/min to $4 \times 10^{-5}$ mol/min. On the other hand, TMA and TMG were supplied at rates of $1 \times 10^{-6}$ mol/min to $4 \times 10^{-5}$ mol/min and $3 \times 10^{-6}$ mol/min to $1.8 \times 10^{-5}$ mol/min, respectively. The V/III ratio fell within the range of between 0.8 and 2. Where the V/III ratio was smaller than 0.8, the surface morphology of the AlGaAs film formed was deteriorated and the III-group metal was deposited on the surface. Where the V/III ratio was larger than 2, deterioration of the surface morphology was recognized in the AlGaAs film formed. The film-growth rate was found to be 1 μm/hr to 5 μm/hr. The grown AlGaAs film was found to be of p-type conductivity in any of the samples. It has also been found that the carrier concentration was increased with decrease in the V/III ratio. The p-type carrier concentration determined by Van der Pauw method was found to be $1 \times 10^{19}$ cm$^{-3}$ to $5 \times 10^{20}$ cm$^{-3}$. Also, the impurity concentration was measured by Secondary Ion Mass Spectrometry, with the result that the carbon concentration was found to be substantially identical with the carrier concentration. Where the V/III ratio was set constant, the higher Al content of the compound semiconductor film grown has been found to lead to the higher carbon concentration and the higher carrier concentration. Further, profile of the carbon concentration was examined, with the result that the carbon concentration was steeply changed from the level of $5 \times 10^{19}$ cm$^{-3}$ to the detectable lowest level of $10^{17}$ cm$^{-3}$ or less within a range less than the resolution of 300 Å.

The surface morphology was improved again where the V/III ratio in the raw material gases was 10 or more. In this case, however, a large amount of hillocks, i.e., scores of tens to hundreds of thousands of hillocks per square centimeter, were recognized. On the contrary, where the V/III ratio was set small to permit the mirror-like growth as in the present invention, the hillock concentration was lower than 10,000/cm$^2$, which is substantially negligible.

EXAMPLE 3

A compound semiconductor crystal having a p-n junction as shown in FIG. 1 was manufactured by the method of the present invention. In the first step, a p-type AlGaAs layer 2 having a p-type carrier concentration of $2 \times 10^{19}$ cm$^{-3}$ was grown in a thickness of 9000 Å on the surface of a p-type GaAs <100> substrate 1 by the gaseous phase epitaxial growth method described in Example 2 using TMG, TMA and AsH$_3$ as raw material gases. Then, an n-type AlGaAs layer 3 having an n-type carrier concentration of $1 \times 10^{18}$ cm$^{-3}$ was grown in a thickness of 3500 Å on the surface of the p-type AlGaAs layer 2 using triethyl gallium (TEG), triethyl aluminum (TEA), AsH$_3$, and silane (SiH$_4$) as raw material gases.

FIG. 2 shows the carrier concentration profile of the crystal having the p-n junction thus formed. The change in the carrier concentration across the p-n junction was achieved within a range less than the resolution of 100 Å. This is because a small diffusion coefficient of carbon enables the position of the p-n junction in this embodiment to substantially overlap with the hetero junction interface of Al$_x$Ga$_{1-x}$As/Al$_y$Ga$_{1-y}$As (0<x; y<1; x=y). For comparison, an n-type layer was formed by adding Mg or Zn to the p-type AlGaAs layer 2 so as to prepare a crystal having a p-n junction, as shown in FIG. 2. In this case, the change in the carrier concentration across the p-n junction required at least 200 Å.

In Example 3, TMG and TMA were used in combination to grow the p-type AlGaAs layer 2. However, it is also possible to use in the present invention the combination of TMG and TEA or the combination of TEG and TMA in place of the combination of TMG and TMA. It is important to note that, in order to form a good n-type compound semiconductor layer with a high controllability, the crystal growth should be carried out under a V/III ratio larger than the level at which the surface morphology is deteriorated, no matter what combination of the compounds of the III-group elements noted above may be employed.

In Example 3, the p-n junction was formed at the hetero junction interface of $Al_xGa_{1-x}As/Al_yGa_{1-y}As$ ($0<x$; $y<1$; $x=y$). However, a satisfactory p-n junction can also be formed at the homo junction interface of GaAs/GaAs structure or at the homo junction interface of AlGaAs/AlGaAs structure. Further, it is apparent that the technical idea of the present invention is applicable to the formation of a p-type compound semiconductor layer containing the III-group element of at least one of Ga and Al and the V-group element of As.

FIG. 3 schematically shows the construction of an MOCVD apparatus used in Examples 4 to 7 of the present invention, which will be described later. As seen from the drawing, the apparatus comprises a reaction vessel 11. A susceptor 13 formed of graphite, which is supported by a rotary shaft 12, is housed in the reaction vessel 11. A single crystal of GaAs substrate 14 is disposed on the susceptor 13. The susceptor 13 is heated by a high frequency coil 15 so as to maintain the substrate 14 at a high predetermined temperature.

A carrier gas ($H_2$ gas) is supplied to a gas line 18. The carrier gas is also supplied through mass flow controllers 41, 42, 43 to each of bubblers 31, 32, 33 having alkylated compounds having a methyl group, i.e., TMG, TMA and trimethyl indium (TMI), housed therein. These bubblers are maintained at a predetermined temperature by constant temperature baths 21, 22, 23. The carrier gas passing through these bubblers is mixed with the carrier gas stream flowing within the gas line 18 and, then, introduced into the reaction vessel 11 through a gas inlet port 16 formed at the upper end of the reaction vessel 11. The gas within the reaction vessel is discharged through a gas discharge pipe 17 connected to a pump 46 operable under hydraulic pressure. Further, a needle valve 47 is interposed in the gas discharge pipe 17.

On the other hand, hydrogenated compounds of $AsH_3$ and $SiH_4$ are supplied to the gas line 18 through mass flow controllers 44 and 45, respectively. If the carrier gas mixed with TMG and TMA vapors and with an $AsH_3$ gas is introduced into the reaction vessel 11, the raw material gases are thermally decomposed on the substrate 14 so as to achieve growth of a GaAs or AlGaAs layer.

EXAMPLE 4

An epitaxial growth was carried out using the apparatus shown in FIG. 3. A $H_2$ gas was used as a carrier gas. Also, the carrier gas was allowed to flow into the reaction vessel in an amount of 5 liters, and the pressure within the reaction vessel was controlled at 70 Torr. Further, a hydrogen gas was passed into the TMG bubbler 31 at a flow rate of 15 sccm, and a GaAs film was grown in a thickness of 1 micron on a GaAs substrate 14 by changing the flow rate of $AsH_3$ gas. In this Example, the molar ratio R of $AsH_3$/TMG was set small such that the film growing rate would be proportional to only the supply rate of $AsH_3$, i.e., compound of V-group element.

Figure 4:
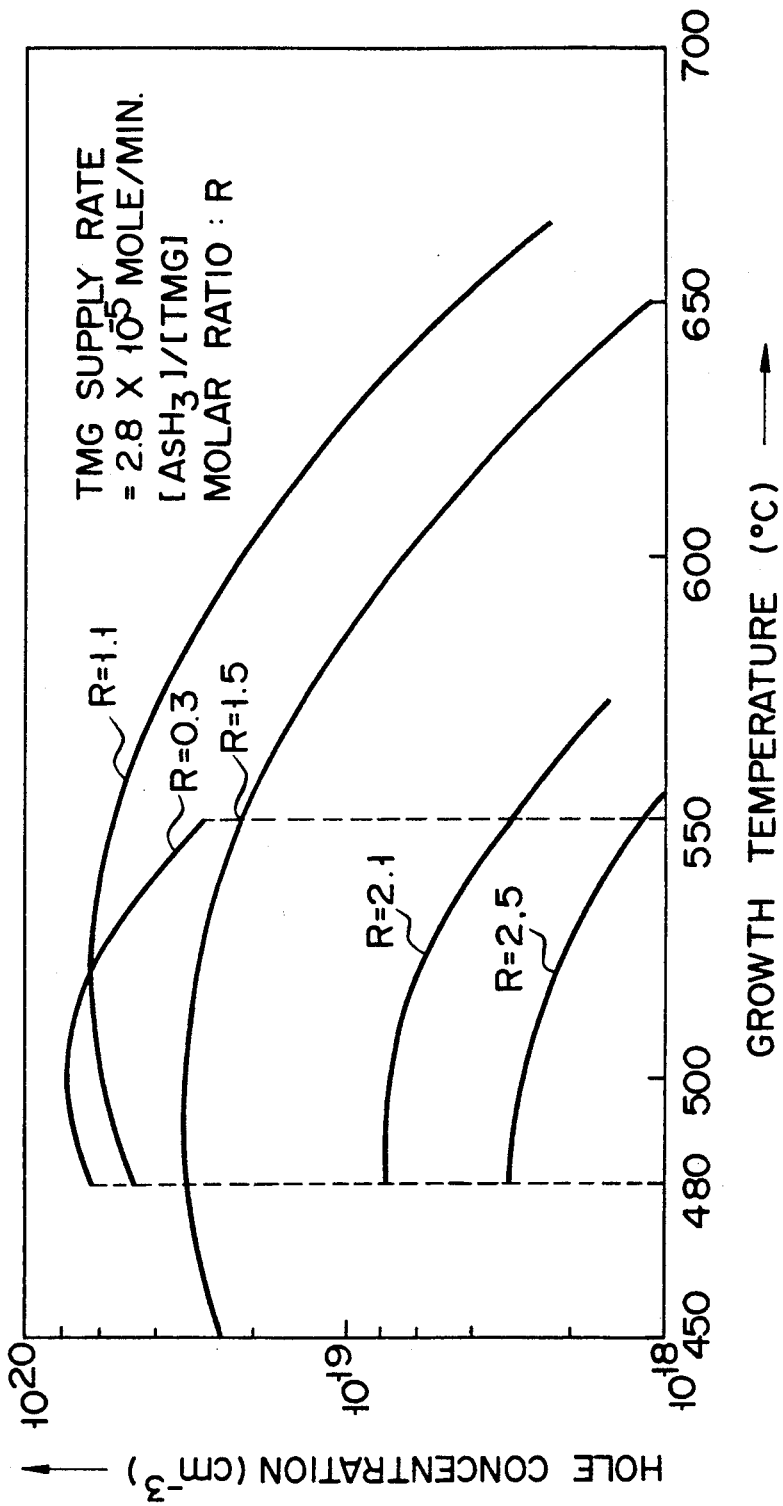
FIG. 4 is a graph showing the relationship between the film-growth temperature and the hole concentration with respect to thin films formed by the method of the present invention under various V/III molar ratios.

The conductivity of the thin film thus formed was found to be of p-type. Also, changes in the hole concentration were measured relative to the change in the crystal growth temperature ranging between 450° C. and 650° C. and to the change in the $AsH_3$/TMG molar ratio R ranging between 0.3 and 2.5, with the results as shown in FIG. 4. It is seen that the hole concentration is consecutively changed within the range between $1 \times 10^{18}$ and $8 \times 10^{19}$ cm$^{-3}$. When observed by an interferene microscope, the surface of the grown crystal was found to be smooth like the mirror surface. FIG. 5 shows the relationship between the film-growth rate and the temperature, covering the cases where the $AsH_3$/TMG molar ratio R was set at 1.1, 1.5, 2.1 and 2.5. As apparent from the graph, the film-growth rate can be determined by controlling the film-growth temperature and the ratio R, making it possible to control the thickness of the formed film. Incidentally, the experimental results shown in FIGS. 4 and 5 were obtained with a high reproducibility.

Another experiment was conducted to grow a p-type AlGaAs thin film having a mirror-like smooth surface by passing a hydrogen gas and a diluted TMA gas into the reaction vessel together with the TMG gas. It was found possible to control the hole concentration at $1 \times 10^{18}$ to $1 \times 10^{20}$ cm$^{-3}$ with a high reproducibility by properly controlling the film-growth temperature and the $AsH_3$ flow rate.

The relationship between the molar ratio R and the hole concentration was examined, with the results as shown in FIG. 6. As seen from the graph of FIG. 6, the carrier concentration was not more than $1 \times 10^{15}$ cm$^{-3}$ where the molar ratio R was 20 or more as in the prior art. On the other hand, the carrier concentration was markedly increased, where the molar ratio R was 3 or less. It should be noted that the carrier concentration can be further increased, if the film-growth temperature Ts is lowered. As a matter of fact, the relationship between the carrier concentration and the molar ratio R was examined under temperatures ranging between 450° and 650° C. within which a good crystal growth be obtained. The carrier concentration of $7 \times 10^{19}$ cm$^{-3}$ was obtained under the film-growth temperature Ts of 520° C. and the molar ratio R of 0.75. Also, the carrier concentration of $1 \times 10^{18}$ cm$^{-3}$ was obtained under the film-growth temperature Ts of 650° C. and the molar ratio R of 1.5 or under the film-growth temperature Ts of 550° C. and the molar ratio R of 2.5.

Still another experiment was conducted by supplying TMG and TMA simultaneously into the reaction vessel. In this experiment, the substrate temperature was set at 520° C., and the mixing ratio of the TMG and TMA gases, i.e., TMA/(TMG +TMA), was set at 0.2. Further, the V/III ratio was 0.8 or less. Obtained was a crystal of $Al_{0.07}Ga_{0.93}As$ having hole concentration of $1 \times 10^{20}$ cm$^{-3}$. This experiment demonstrates that it is necessary to set the molar ratio R to fall within the range of between 0.3 and 2.5 in order to achieve a carrier concentration of $1 \times 10^{18}$ to $1 \times 10^{20}$ cm$^{-3}$ required for a p-type GaAs or AlGaAs layer included in a semiconductor device.

FIG. 7 shows the surface state of the grown film relative to the film-growth rate and the V/III molar ratio. It has been confirmed that deterioration of the surface morphology takes place in the grown film, if the V/III molar ratio widely deviates from the range of between 0.3 and 2.5.

The minority carrier life time of a p-type GaAs layer grown by the method of the present invention was measured by a time-resolved photo luminescence intensity measuring method, obtaining a value of 600 psec with respect to a p-type carrier concentration of $2 \times 10^{19}$ cm$^{-3}$. This value is substantially the same as the minority carrier life time of a p-type GaAs layer of the same carrier concentration grown by another method using a dopant material, which is reported in, for example, "H.C. Casey and M.B. Panish, Heterostructure Laser, P 161, Academic press, 1978". This indicates that a thin film grown by the method of the present invention exhibits excellent crystal properties.

EXAMPLE 5

Hetero bipolar transistors as shown in FIGS. 8A and 8B were manufactured by employing the method of the present invention. The transistor shown in FIG. 8A comprises a semi-insulating GaAs substrate 60, an undoped GaAs buffer layer 61, an n$^-$-GaAs collector layer 62, a p$^+$-GaAs base layer 63, an undoped GaAs spacer layer 64, an n-Al$_{0.3}$Ga$_{0.7}$As emitter layer 65, an n$^+$-GaAs layer 66, and an n$^+$-InGaAs ohmic contact layer 67. On the other hand, the transistor shown in FIG. 8B comprises a semi-insulating GaAs substrate 60, an undoped GaAs buffer layer 61, an n$^-$-GaAs collector layer 62, a p$^+$-Al$_x$Ga$_{1-x}$As (x=0 to 0.3) base layer 68, an AlGaAs spacer layer 69, an n-Al$_{0.3}$Ga$_{0.7}$As emitter layer 65, an n$^+$-GaAs layer 66, and an n$^+$-InGaAs ohmic contact layer 67.

In manufacturing the bipolar transistor shown in FIG. 8A, the layers 61, 62 and 64 to 67 were formed by an epitaxial growth method of the present invention, in which the AsH$_3$ flow rate was set at 400 sccm and the film-growth temperature was set at 680° C. On the other hand, the p$^+$-GaAs base layer 63 was formed under the film-growth temperature of 550° C., the H$_2$-diluted 10% AsH$_3$ flow rate of 10 sccm, the H$_2$ flow rate into the TMG bubbler of 13.05 sccm, and the V/III molar ratio R of 1.

In manufacturing the bipolar transistor shown in FIG. 8B, the AlGaAs base layer 68 was formed as in the manufacture of the transistor shown in FIG. 8A with respect to the film-growth temperature, the AsH$_3$ flow rate, and the H$_2$ gas flow rate into the TMG bubbler. In addition, the H$_2$ gas flow rate into the TMA bubbler was continuously changed so as to enable the AlGaAs base layer 68 to have a composition gradient. The hetero bipolar transistor shown in FIGS. 8A and 8B were both found to exhibit satisfactory DC characteristics.

EXAMPLE 6

A compound semiconductor device as shown in FIG. 9 was manufactured by the method of the present invention. As shown in the drawing, the device comprises a semiinsulating GaAs substrate 70, an undoped GaAs buffer layer 71, an undoped Al$_{0.3}$Ga$_{0.7}$As spacer layer 72, a p$^+$-Al$_{0.3}$Ga$_{0.7}$As hole supply layer 73, and an undoped GaAs layer 74. The p$^+$-Al$_{0.3}$Ga$_{0.7}$As hole supply layer 73 was formed under the conditions that the molar ratio of the AsH$_3$ to the III-group materials of TMG and TMA was set to fall within the range of between 1 and 2, and that the film-growth temperature was set to fall within the range of 550° C. to 620° C. The hole supply layer 73 thus formed exhibited a good mirror-like smooth surface. Also, the manufactured compound semiconductor device exhibited good DC characteristics.

As apparent from the Examples described above, the method of the present invention makes it possible to form a p-type GaAs or AlGaAs layer having a desired doping profile within a carrier concentration range of between $1 \times 10^{18}$ to $1 \times 10^{20}$ cm$^{-3}$ by means of MOCVD. It is important to note that the doping profile can be accurately controlled in the present invention. As a result, the method of the present invention permits easily manufacturing a semiconductor device including a p-type GaAs or AlGaAs layer requiring a high carrier concentration. What should also be noted is that the p-type layer can be continuously grown in the method of the present invention, making it possible to eliminate a special valve operation required for the switching of the gas supply. It follows that any special load is not applied to the film-growth apparatus. Further, a new raw material is not used as a p-type dopant material. Thus, the apparatus, in particular, the piping system is not stained with an impurity, leading to the growth of a thin film having a high purity.

EXAMPLE 7

Figures 10, 11:
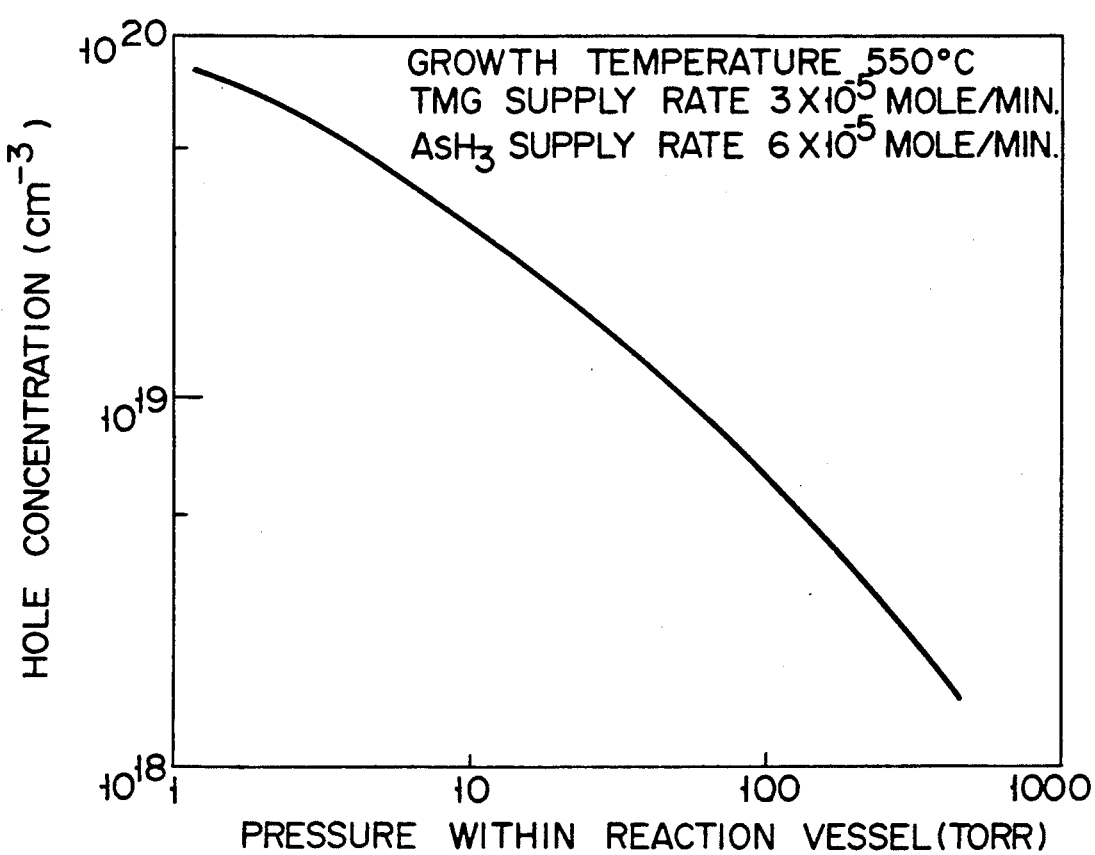

Manufactured in this Example was a hetero bipolar transistor constructed as shown in FIG. 10, which included a thin p-type base layer doped with a high concentration of an impurity. As seen from the drawing, the hetero bipolar transistor comprised an undoped GaAs buffer layer 81, an n$^+$-GaAs contact layer 82 having a Si concentration of $4 \times 10^{18}$ cm$^{-3}$, an n-GaAs collector layer 83 having a Si concentration of $7 \times 10^{16}$ cm$^{-3}$, a p$^+$-GaAs base layer 84 having a hole concentration of $5 \times 10^{19}$ cm$^{-3}$, an n-In$_{0.1}$Al$_{0.36}$Ga$_{0.54}$As emitter layer 85 having a Si concentration of $5 \times 10^{17}$ cm$^{-3}$, an n-Al$_{0.3}$Ga$_{0.7}$As emitter layer 86 having a Si concentration of $5 \times 10^{17}$ cm$^{-3}$, and an n$^+$-GaAs contact layer 87 having a Si concentration of $4 \times 10^{18}$ cm$^{-3}$. These layers 81 to 87 were formed in the order noted above on the surface of a GaAs substrate 80 having a crystal axis direction of <100> by the MOCVD method using TMG, TMA, TMI, DMZ, AsH$_3$ and SiH$_4$ as raw material gases. The p$^+$-GaAs base layer 84 was 800 Å thick, which was doped with Zn in a thickness of 600 Å on the side of the collector layer and with C in a thickness of 200 Å on the side of the emitter layer. In the conventional device, Zn alone is used as a p-type impurity of the GaAs base layer. In this case, the n-type emitter layer tends to be inverted into a p-type because of the diffusion of Zn. To overcome this problem, it was customary in the past to form an undoped GaAs layer between the p$^+$-GaAs base layer and the n-Al$_{0.3}$Ga$_{0.7}$As emitter layer 86. In the embodiment shown in FIG. 10, however, the portion corresponding to the spacer layer of the conventional device is doped with C. The distribution of the carbon atoms in the thickness direction was measured by SIMS. Carbon atoms were found to have been slightly diffused toward the n-Al$_{0.3}$Ga$_{0.7}$As emitter layer 86. However, the DC characteristics of the manufactured semiconductor device have been found to be satisfactory. Also, the "on" voltage has been found to be normal. These indicate that the hetero junction and the p-n junction were formed as designed in spite of the carbon diffusion.

The semiconductor device shown in FIG. 10 is featured in that an indium-containing layer, i.e., InGaAs layer or AlGaInAs layer, is newly formed between the n-AlGaAs emitter layer 86 and the p$^+$-GaAs base layer 84, and that carbon is used as a p-type dopant in at least a part of the p$^+$-GaAs base layer. It should be noted that carbon is amphoteric. When contained in a GaAs or AlGaAs layer, carbon is activated by substantially 100% so as to act as an acceptor. On the other hand, when contained in a InGaAs or InAlGaAs layer, carbon tends to act as a donor. This is significant in the structure consisting of an AlGaAs or GaAs layer doped with a high concentration of carbon and an n-type InAlGaAs or InGaAs layer directly laminated on the AlGaAs or GaAs layer. To be more specific, the carbon atoms, even if diffused from the AlGaAs or GaAs layer, act as an n-type impurity within the In-containing layer, with the result that the position of the p-n junction is not deviated. In short, it is possible to suppress the deviation between the emitter-base hetero interface and the p-n junction interface in a hetero bipolar transistor by using an InAlGaAs layer as a part of the emitter layer on the side of the base layer or by using an InGaAs layer as a part of the GaAs base layer on the side of the emitter layer.

Incidentally, it is possible to prevent the formation of crystal defects at the emitter-base junction interface by setting the thickness of the In-containing layer at a level lower than the critical thickness at which rearrangement takes place.

EXAMPLE 8

The relationship between the hole concentration and the pressure within the reaction vessel was examined by using an apparatus constructed as shown in FIG. 3.

Specifically, a GaAs layer was grown in a thickness of 1 micron on the substrate 14. In this experiment, 10 liters of a $H_2$ gas as a carrier gas was supplied into the reaction vessel 11 while evacuating the reaction vessel through the gas discharge pipe 17. A hydrogen gas was supplied to the TMG bubbler 31 at a flow rate of 15 sccm. Also, an $AsH_3$ gas supplied to the reaction vessel 11 such that the molar ratio or $AsH_3$ to TMG would be 2. For forming the desired GaAs layer, the temperature within the reaction vessel was set at 550° C. so as to cause thermal decomposition of the raw material gases. During the epitaxial growth operation, the opening degree of the needle valve 47 mounted to the gas discharge pipe 17 was adjusted so as to control the pressure within the reaction vessel 11 at 1 to 400 Torr. The GaAs layer thus formed has been found to be of p-type conductivity. Also, the hole concentration has been found to be continuously changed from $1 \times 10^{17}$ to $8 \times 10^{19}$ cm$^{-3}$ as shown in FIG. 11 with respect to the change in the pressure within the reaction vessel 11 between 1 and 400 Torr. In addition, the result shown in FIG. 11 was obtained with a high reproducibility. The GaAs layer thus formed was observed with an interference microscope, with the result that the grown crystal exhibited a smooth mirror-like surface.

An additional experiment was conducted in which TMA gas diluted with a hydrogen gas was also supplied to the reaction vessel together with the TMG gas. It was possible to obtain a p-type AlGaAs layer having a mirror-like surface in this experiment, too. It was also possible to control the hole concentration within the range of between $1 \times 10^{18}$ and $1 \times 10^{20}$ cm$^{-3}$ with a high reproducibility by adjusting the pressure within the reaction vessel at 1 to 400 Torr.

The present invention is not restricted to the preferred embodiments described above with reference to the accompanying drawings. In other words, various modifications and improvements can be achieved within the technical scope of the present invention. For example, it is possible to apply the technical idea of the present invention to the manufacture of various semiconductor devices such as a hetero bipolar transistor, a p-channel HEMT, a semiconductor laser and a hot electron transistor including p-type GaAs, AlGaAs and AlAs layers.

What is claimed is:

1. A method for manufacturing on a substrate a p-type compound semiconductor thin film containing a III-group element of at least one of Ga and Al and a V-group element of As by metal organics chemical vapor deposition, comprising the steps of:

selecting an alkylated compound having a methyl group as a raw material gas of the III-group element compound;

selecting a hydrogenated compound as a raw material gas of the V-group element compound;

setting growing conditions including a molar ratio (V/III) of the V-group element supply rate to the III-group element supply rate in order to grow the film on the substrate housed in a reactor so as to bring about growth of a crystal having a mirror-like surface, said growing conditions being limited to within a range defined by first and second states, said first state being a state where of the V-group element supply rate to the III-group element said molar ratio is less than 1 and growth of a crystal having a non-mirror surface takes place, and said second state being a state where said ratio is greater than 1 and growth of a crystal having a non-mirror surface takes place; and introducing said raw material gases into the reactor to epitaxially grow the film on the substrate.

2. The method according to claim 1, wherein the alkylated compound of the III-group element is selected from the group consisting of trimethyl gallium and trimethyl aluminum, and the hydrogenated compound of the V-group element is arsine.

3. The method according to claim 2, wherein the molar ratio falls within the range of between 0.3 and 2.5.

4. The method according to claim 2, wherein the semiconductor thin film is grown under the temperature falling within the range of between 450° and 700° C.

5. The method according to claim 2, wherein the semiconductor thin film is grown under the pressure falling within the range of between 1 and 400 Torr.

6. The method according to claim 1, wherein the carrier concentration of the semiconductor thin film falls within the range of between $1 \times 10^{18}$ and $1 \times 10^{20}$ cm$^{-3}$.

7. A method for manufacturing on substrate a p-type compound semiconductor thin film containing a III-group element of at least one of Ga and Al and a V-group element of As by metal organics chemical vapor deposition, comprising the steps of:

selecting an alkylated compound having a methyl group as a raw material gas of the III-group element compound;

selecting a hydrogenated compound as a raw material gas of the V-group element compound;

setting growing conditions including a molar ratio (V/III) of the V-group element supply rate to the III-group element supply rate in order to grow the film on the substrate housed in a reactor so as to bring about growth of a crystal having a mirror-like surface, said molar ratio being within a range such that the growth rate of the film depends on the supply rate of the hydrogenated compound of the V-group element; and introducing said raw material gases into the reactor to epitaxially grow the film on the substrate.

8. The method according to claim 7, wherein said growing conditions are limited to within a range defined by first and second states, said first state being a state where said molar ratio is less than 1 and growth of a crystal having a non-mirror surface takes place, and said second state being a state where said ratio is greater than 1 and growth of a crystal having a non-mirror surface takes place.

9. The method according to claim 7, wherein the alkylated compound of the III-group element is selected from the group consisting of trimethyl gallium and trimethyl aluminum, and the hydrogenated compound of the V-group element is arsine.

10. The method according to claim 8, wherein the molar ratio falls within the range of between 0.3 and 2.5.

11. The method according to claim 9, wherein the semiconductor thin film is grown under the temperature falling within the range of between 450° and 700° C.

12. The method according to claim 9, wherein the semiconductor thin film is grown under the pressure falling within the range of between 1 and 400 Torr.

13. The method according to claim 7, wherein the carrier concentration of the semiconductor thin film falls within the range of between $1 \times 10^{18}$ and $1 \times 10^{20}$ $cm^{-3}$.

14. A method for manufacturing on a substrate a p-type compound semiconductor thin film containing a III-group element of at least one of Ga and Al and a V-group element of As by metal organics chemical vapor deposition, comprising the steps of:

selecting an alkylated compound having a methyl group as a raw material gas of the III-group element compound;

selecting a hydrogenated compound as a raw material gas of the V-group element compound;

setting a molar ratio (V/VIII) of the V-group element supply rate to the III-group element supply rate to fall within the range of between 0.3 and 2.5 in order to grow the film on the substrate housed in a reactor; and introducing said raw material gases into the reactor to epitaxially grow the film on the substrate.

15. The method according to claim 14, wherein the semiconductor thin film is grown at a temperature falling within the range of between 450° and 700° C.

16. The method according to claim 14, wherein the semiconductor thin film is grown at a pressure falling within the range of between 1 and 400 Torr.

17. The method according to claim 14, wherein the carrier concentration of the semiconductor thin film falls within the range of between $1 \times 10^{18}$ and $1 \times 10^{20}$ $cm^{-3}$.

* * * * *